(12) United States Patent
Wasserman et al.

(10) Patent No.: US 12,255,264 B2
(45) Date of Patent: Mar. 18, 2025

(54) ENHANCED ROOM TEMPERATURE MID-IR LEDS WITH INTEGRATED SEMICONDUCTOR 'METALS'

(71) Applicant: Board of Regents, The University of Texas System, Austin, TX (US)

(72) Inventors: Daniel Wasserman, West Lake Hills, TX (US); Seth Bank, Austin, TX (US); Andrew Briggs, Austin, TX (US); Leland Nordin, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 743 days.

(21) Appl. No.: 17/358,157

(22) Filed: Jun. 25, 2021

(65) Prior Publication Data

US 2021/0408324 A1   Dec. 30, 2021

Related U.S. Application Data

(60) Provisional application No. 63/044,395, filed on Jun. 26, 2020.

(51) Int. Cl.
*H01L 33/06* (2010.01)
*H01L 33/00* (2010.01)
*H01L 33/30* (2010.01)

(52) U.S. Cl.
CPC .......... *H01L 33/06* (2013.01); *H01L 33/0025* (2013.01); *H01L 33/30* (2013.01)

(58) Field of Classification Search
CPC ...... H01L 33/06; H01L 33/0026; H01L 33/30
See application file for complete search history.

(56) References Cited

U.S. PATENT DOCUMENTS

| | | | |
|---|---|---|---|
| 2008/0042122 A1* | 2/2008 | Hatori | H01S 5/12 438/47 |
| 2011/0006282 A1* | 1/2011 | Hatori | H01S 5/12 257/E33.024 |
| 2017/0179317 A1* | 6/2017 | Huang | H01L 31/035263 |
| 2020/0328320 A1* | 10/2020 | Wasserman | H01L 31/0224 |

OTHER PUBLICATIONS

Adams, D. C., et al. "Funneling light through a subwavelength aperture with epsilon-near-zero materials." Physical review letters 107.13 (2011): 133901.
Adams, D. C., et al. "Plasmonic mid-infrared beam steering." Applied Physics Letters 96.20 (2010): 201112.

(Continued)

*Primary Examiner* — Mark W Tornow
(74) *Attorney, Agent, or Firm* — Meunier Carlin & Curfman LLC (57) ABSTRACT

Mid-IR light emitting diodes (LEDs) based on type-II quantum dot (QD) active regions grown with monolithically integrated semiconductor metal layers are provided. These LEDs comprise layers of type-II semiconductor (e.g., InGaSb) quantum dots integrated into a pn junction diode (e.g., InAs) grown above a highly doped backplane, such as an n++ InAs backplane, all in the same epitaxial growth. Aspects described herein minimize non-radiate recombination times and significantly increase radiative recombination rates by controlling the emission of the emitting QDs in the near field of an optical metal.

15 Claims, 6 Drawing Sheets

(56) References Cited

OTHER PUBLICATIONS

Adato, Ronen, et al. "Ultra-sensitive vibrational spectroscopy of protein monolayers with plasmonic nanoantenna arrays." Proceedings of the National Academy of Sciences 106.46 (2009): 19227-19232.
Alù, Andrea, and Nader Engheta. "All optical metamaterial circuit board at the nanoscale." Physical review letters 103.14 (2009): 143902.
Bidaux, Yves, et al. "Plasmon-enhanced waveguide for dispersion compensation in mid-infrared quantum cascade laser frequency combs." Optics letters 42.8 (2017): 1604-1607.
Breen, Michael, et al. "High speed mid-infrared detectors based on MEMS resonators and spectrally selective metamaterials." 2016 IEEE International Frequency Control Symposium (IFCS). IEEE, 2016.
Brueck, S. R. J. "Radiation from a dipole embedded in a dielectric slab." IEEE Journal of Selected Topics in Quantum Electronics 6.6 (2000): 899-910.
Butun, Serkan, Sefaattin Tongay, and Koray Aydin. "Enhanced light emission from large-area monolayer MoS2 using plasmonic nanodisc arrays." Nano letters 15.4 (2015): 2700-2704.
Das, Naresh C., et al. "Infrared (3.8 µm) interband cascade light-emitting diode array with record high efficiency." Applied Physics Letters 87.4 (2005): 041105.
Dev, Sukrith, et al. "Optical mapping of RF field profiles in resonant microwave circuits." IEEE Photonics Technology Letters 30.4 (2017): 331-334.
Dongmo, Pernell, et al. "Enhanced room temperature electronic and thermoelectric properties of the dilute bismuthide InGaBiAs." Journal of Applied Physics 112.9 (2012): 093710.
Edwards, Brian, and Nader Engheta. "Experimental verification of displacement-current conduits in metamaterials-inspired optical circuitry." Physical review letters 108.19 (2012): 193902.
Eggleston, Michael S., et al. "Optical antenna enhanced spontaneous emission." Proceedings of the National Academy of Sciences 112.6 (2015): 1704-1709.
Faist, Jérôme. "Wallplug efficiency of quantum cascade lasers: Critical parameters and fundamental limits." Applied physics letters 90.25 (2007): 253512.
Felts, Jonathan R., et al. "Near-field infrared absorption of plasmonic semiconductor microparticles studied using atomic force microscope infrared spectroscopy." Applied Physics Letters 102.15 (2013): 152110.
Fleury, Romain, and Andrea Alu. "Enhanced superradiance in epsilon-near-zero plasmonic channels." Physical Review B 87.20 (2013): 201101.
Genet, C., & Ebbesen, T. W. (2007). Light in tiny holes. Nature, 445(7123), 39-46. doi:10.1038/nature05350.
Haacke, G. "New figure of merit for transparent conductors." Journal of Applied Physics 47.9 (1976): 4086-4089.
Hirsch, Leon R., et al. "Nanoshell-mediated near-infrared thermal therapy of tumors under magnetic resonance guidance." Proceedings of the National Academy of Sciences 100.23 (2003): 13549-13554.
IoffeLED, "Optically immersed 7.0 mm optically pumped led in heatsink optimized housing, OPLED70Sr datasheet,".
Jung, D., et al. "Next-generation mid-infrared sources." Journal of Optics 19.12 (2017): 123001.
Jung, D., Yu, L., Dev, S., Wasserman, D., & Lee, M. L. (2016). Room-temperature mid-infrared quantum well lasers on multi-functional metamorphic buffers. Applied Physics Letters, 109(21), 211101. doi:10.1063/1.4968560.
Khurgin, Jacob B., and Alexandra Boltasseva. "Reflecting upon the losses in plasmonics and metamaterials." MRS bulletin 37.8 (2012): 768-779.
Khurgin, Jacob B., and Greg Sun. "Comparative analysis of spasers, vertical-cavity surface-emitting lasers and surface-plasmon-emitting diodes." Nature Photonics 8.6 (2014): 468-473.
Kim, Myung-Ki, Amit M. Lakhani, and Ming C. Wu. "Efficient waveguide-coupling of metal-clad nanolaser cavities." Optics express 19.23 (2011): 23504-23512.
Lau, Erwin K., et al. "Enhanced modulation bandwidth of nanocavity light emitting devices." Optics Express 17.10 (2009): 7790-7799.
Law, S., et al. "All-semiconductor negative-index plasmonic absorbers." Physical review letters 112.1 (2014): 017401.
Law, S., et al. "Mid-infrared designer metals." Optics express 20.11 (2012): 12155-12165.
Law, Stephanie, et al. "All-semiconductor plasmonic nanoantennas for infrared sensing." Nano letters 13.9 (2013): 4569-4574.
Law, Stephanie, Runyu Liu, and Daniel Wasserman. "Doped semiconductors with band-edge plasma frequencies." Journal of Vacuum Science & Technology B, Nanotechnology and Microelectronics: Materials, Processing, Measurement, and Phenomena 32.5 (2014): 052601.
Lévesque, A., et al. "Temperature dependence of the photoluminescence spectra from InAs (P)/InP multilayers containing thick quantum dots: Dot-size-dependent carrier dynamics." Physical Review B 83.23 (2011): 235304.
Levesque, Maximilien, et al. "Simple concentration-dependent pair interaction model for large-scale simulations of Fe—Cr alloys." Physical Review B 84.18 (2011): 184205.
Liu, R., et al. "Enhanced responsivity resonant RF photodetectors." Optics express 24.23 (2016): 26044-26054.
Liu, R., et al. "Multiplexed infrared photodetection using resonant radio-frequency circuits." Applied Physics Letters 108.6 (2016): 061101.
Liu, R., Zhao, X., Roberts, C., Yu, L., Mohseni, P. K., Li, X., . . . Wasserman, D. (2015). Enhanced Optical Transmission through MacEtch-Fabricated Buried Metal Gratings. Advanced Materials, 28(7), 1441-1448. doi:10.1002/adma.201505111.
Liu, Runyu, et al. "Epsilon-near-zero photonics wires." ACS Photonics 3.6 (2016): 1045-1052.
Lu, Yu-Jung, et al. "Plasmonic nanolaser using epitaxially grown silver film." Science. Jul. 27, 2012;337(6093):450-3. doi: 10.1126/science.1223504.
Maas, Ruben, et al. "Experimental realization of an epsilon-near-zero metamaterial at visible wavelengths." Nature Photonics 7.11 (2013): 907-912.
Markov, Ivan. "Kinetics of surfactant-mediated epitaxial growth." Physical Review B 50.15 (1994): 11271.
Mason, J. A., S. Smith, and D. J. A. P. L. Wasserman. "Strong absorption and selective thermal emission from a midinfrared metamaterial." Applied Physics Letters 98.24 (2011): 241105.
Neumann, Oara, et al. "Solar vapor generation enabled by nanoparticles." ACS nano 7.1 (2013): 42-49.
Noginov, M. A., et al. "Demonstration of a spaser-based nanolaser." Nature 460.7259 (2009): 1110-1112.
Nordin, L., et al. "Enhanced emission from ultra-thin long wavelength infrared superlattices on epitaxial plasmonic materials." Applied Physics Letters 116.2 (2020): 021102.
Pillai, M. R., et al. "Growth of In x Ga 1-x As/GaAs heterostructures using Bi as a surfactant." Journal of Vacuum Science & Technology B: Microelectronics and Nanometer Structures Processing, Measurement, and Phenomena 18.3 (2000): 1232-1236.
Purcell "Spontaneous emission probabilities at radio frequencies" Phys. Rev. 69, 681 (1946).
Russell, Kasey J., et al. "Large spontaneous emission enhancement in plasmonic nanocavities." Nature Photonics 6.7 (2012): 459-462.
Sakamoto, Kunihiro, et al. "Which surfactant shall we choose for the heteroepitaxy of ge/si (001) ?-bi as a surfactant with small self-incorporation—." Japanese journal of applied physics 32.2A (1993): L204.
Sirtori, Carlo, et al. "Long-wavelength ( ?? 8-11.5 ?? µm) semiconductor lasers with waveguides based on surface plasmons." Optics letters 23.17 (1998): 1366-1368.
Sirtori, Carlo, et al. "Low-loss Al-free waveguides for unipolar semiconductor lasers." Applied Physics Letters 75.25 (1999): 3911-3913.

(56) References Cited

OTHER PUBLICATIONS

Soric, Jason C., and Andrea Alu. " Longitudinally Independent Matching and Arbitrary Wave Patterning Using ε-Near-Zero Channels." IEEE Transactions on Microwave Theory and Techniques 63.11 (2015): 3558-3567.

Stiles, Paul L., et al. "Surface-enhanced Raman spectroscopy." Annu. Rev. Anal. Chem. 1 (2008): 601-626.

Streyer, W., et al. "Engineering absorption and blackbody radiation in the far-infrared with surface phonon polaritons on gallium phosphide." Applied Physics Letters 104.13 (2014): 131105.

Streyer, W., et al. "Selective absorbers and thermal emitters for far-infrared wavelengths." Applied Physics Letters 107.8 (2015): 081105.

Streyer, W., et al. "Strong absorption and selective emission from engineered metals with dielectric coatings." Optics express 21.7 (2013): 9113-9122.

Streyer, W., Feng, K., Zhong, Y., Hoffman, A. J., & Wasserman, D. (2015). Engineering the Reststrahlen band with hybrid plasmon/phonon excitations. MRS Communications, 6(01), 1-8. doi: 10.1557/mrc.2015.81.

Teissier, R., et al. "Room temperature operation of InAs/ AlSb quantum cascade lasers." Applied physics letters 85.2 (2004): 167-169.

Thongrattanasiri, S., et al. "Multiscale beam evolution and shaping in corrugated plasmonic systems." Optics Express 19.10 (2011): 9269-9281.

Tixier, S., et al. "Surfactant enhanced growth of GaNAs and InGaNAs using bismuth." Journal of crystal growth 251.1-4 (2003): 449-454.

Tournie, E., et al. "Surfactant-mediated molecular-beam epitaxy of III-V strained-layer heterostructures." Journal of crystal growth 150 (1995): 460-466.

Tsakmakidis, Kosmas L., et al. "Large spontaneous-emission enhancements in metallic nanostructures: towards LEDs faster than lasers." Optics express 24.16 (2016): 17916-17927.

Vassant, Simon, et al. "Epsilon-near-zero mode for active optoelectronic devices." Physical review letters 109.23 (2012): 237401.

Vučković, Jelena, et al. "Enhanced single-photon emission from a quantum dot in a micropost microcavity." Applied Physics Letters 82.21 (2003): 3596-3598.

Vuckovic, Jelena, Marko Loncar, and Axel Scherer. "Surface plasmon enhanced light-emitting diode." IEEE Journal of Quantum Electronics 36.10 (2000): 1131-1144.

Yang, Rui Q., et al. "High power mid-infrared interband cascade lasers based on type-II quantum wells." Applied physics letters 71.17 (1997): 2409-2411.

Young, E. C., S. Tixier, and T. Tiedje. "Bismuth surfactant growth of the dilute nitride $GaN_xAs_{1-x}$." Journal of crystal growth 279.3-4 (2005): 316-320.

Yu, Lan, et al. "Engineering carrier lifetimes in type-II In (Ga) Sb/InAs mid-IR emitters." Journal of Vacuum Science & Technology B, Nanotechnology and Microelectronics: Materials, Processing, Measurement, and Phenomena 35.2 (2017): 02B101.

Zabel, Thomas, et al. "Auger recombination in In (Ga) Sb/InAs quantum dots." Applied Physics Letters 106.1 (2015): 013103.

Zhang, Yong-Hang. "Continuous wave operation of $InAs/InAs_x Sb_{1-x}$ midinfrared lasers." Applied physics letters 66.2 (1995): 118-120.

Zhong, Y., et al. "Mid-wave infrared narrow bandwidth guided mode resonance notch filter." Optics Letters 42.2 (2017): 223-226.

Zia, Rashid, et al. "Plasmonics: the next chip-scale technology." Materials today 9.7-8 (2006): 20-27.

\* cited by examiner

ENHANCED ROOM TEMPERATURE MID-IR LEDS WITH INTEGRATED SEMICONDUCTOR 'METALS'

CROSS-REFERENCE TO RELATED APPLICATIONS

This application claims the benefit of priority to U.S. Provisional Patent Application No. 63/044,395, filed on Jun. 26, 2020, entitled "ENHANCED ROOM TEMPERATURE MID-IR LEDS WITH INTEGRATED SEMICONDUCTOR 'METALS'," the contents of which are hereby incorporated by reference in their entirety.

BACKGROUND

The mid-infrared (mid-IR) wavelength range (~2-20 μm) is of vital importance for a range of sensing, security and defense, and fundamental science applications. Mid-infrared optical sources have historically fallen into two primary categories: simple thermal sources and coherent laser sources of light. Simple thermal sources consist solely of a hot object, heated to a temperature where the object gives off significant thermal radiation across the mid-IR. Such sources are broadband, covering the entire mid-IR range, but are also slow and extremely power inefficient.

Laser sources, on the other hand, can offer high powers and collimated beams, as well as faster modulation. Early mid-IR lasers were typically gas lasers ($CO_2$ and HeNe) offering coherent emission only at distinct wavelengths corresponding to optical transitions in a few gases. Recently, in about the past 20 years, a new class of semiconductor lasers (e.g., quantum cascade lasers and interband cascade lasers) have been developed, and now offer high powers able to cover essentially the entire mid-IR by careful design and growth of quantum engineered light emitting regions. However, such sources are extremely poor emitters below threshold (before they start lasing). In other words, these coherent mid-IR sources make extremely poor light emitting diodes (LEDs) in the mid-IR range. The primary reason for the poor sub-threshold emission is the extremely fast non-radiative recombination times for excited carriers in these designs. In other words, the excited carriers recombine and generate heat much faster than they recombine and generate light.

However, there exist important applications for mid-IR LEDs. Chief among them is the development of IR scene projectors, essentially infrared LED TV's, which are used to evaluate and quantify the performance of thermal imaging systems. Additionally, there could be significant applications for IR LEDs in infrared sensing and spectroscopy, or IR signaling, if the power output of mid-IR LEDs could be increased and the cost per LED decreased, when compared to existing coherent IR light sources.

However, the existing state of the art mid-IR LEDs suffer from a number of fundamental problems. One problem is that extremely fast non-radiative recombination times limit the power of such LEDs. Current commercial mid-IR LEDs can source only less than 10 μW of power at 1A of drive current. Another problem is that the use of narrow bandgap semiconductors results in strong nonradiative Auger recombination, which dominates carrier dynamics and the emitted power especially at high drive currents and at higher operating temperatures. In fact, the decay of emitted power from low (liquid nitrogen) temperatures to room temperature is often several orders of magnitude. Yet another drawback is that typical active region designs require complex growth and design, and often require thick epitaxial growth.

SUMMARY

The disclosed structures and methods effectively provide at least an order of magnitude improvement in almost all of the above problems.

Mid-IR light emitting diodes (LEDs) based on type-II quantum dot (QD) active regions grown with monolithically integrated semiconductor metal layers are provided. These LEDs comprise layers of type-II semiconductor (e.g., InGaSb) quantum dots integrated into a pn junction diode (e.g., InAs (Indium Arsenide)) grown above a highly doped backplane, such as an n++ InAs backplane, all in the same epitaxial growth. Aspects described herein significantly increase radiative recombination rate, which allows for increased efficiency emitters by controlling the emission of the emitting QDs in the near field of an optical metal.

In an implementation, a semiconductor structure comprises a highly doped (n++) epitaxial layer and a diode structure disposed above the n++ epitaxial layer.

In an implementation, a semiconductor structure comprises a plasmonic layer as a backplane and a mid-IR LED emitter.

In an implementation, a method of fabricating a semiconductor structure comprises depositing a plasmonic layer on a substrate and growing a QD emitter above the plasmonic layer.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Type-II semiconductor (e.g., InGaSb) quantum dots (QDs) can be grown with pn junction architecture. This allows for active plasmonic devices with integrated quantum engineered emitters. Mid-IR light emitting diodes (LEDs) based on type-II QD active regions grown with monolithically integrated semiconductor metal layers are provided. These LEDs comprise layers of type-II semiconductor (e.g., InGaSb) quantum dots integrated into a pn junction diode (e.g., InAs pn junction diode) grown above a highly doped backplane (e.g., an n++ InAs backplane), all in the same epitaxial growth. Aspects described herein significantly increase radiative recombination rates rate, which allows for increased efficiency emitters by controlling the emission of the emitting QDs in the near field of an optical metal.

Growth techniques are described to grow quantum nanostructures (e.g., QDs) of InGaSb in an InAs matrix. These QDs are so-called type-II quantum dots, where electrons in the conduction band of the InAs recombine with holes confined in the InGaSb. Because of the additional quantum confinement offered by the QD structures, a significant decrease in Auger recombination is expected. Longer lifetimes and improved temperature performance for QD emitters is achieved as compared to quantum well (QW) emitters at the same wavelength.

Moreover, QDs are used as the active light emitters as opposed to superlattice LEDs (SLEDs) or interband cascade LEDs (ICLEDs). The uses of QDs in the structures, methods, and devices described herein differ significantly from existing commercial technology.

In some implementations, a semiconductor structure comprises a highly doped (n++) epitaxial layer, and a diode structure disposed above the n++ epitaxial layer. The diode structure comprises an n-doped InAs layer followed by a p-doped InAs layer, with an unintentionally doped layer between the n and p material forming a pn junction which contains a number of QD layers acting as QD emitters. The combination of the n++ and the pn junction creates a cavity and provides a metallic surface in the near field of the QD emitters which increases radiative recombination rates in the QD layers.

Figure 1:
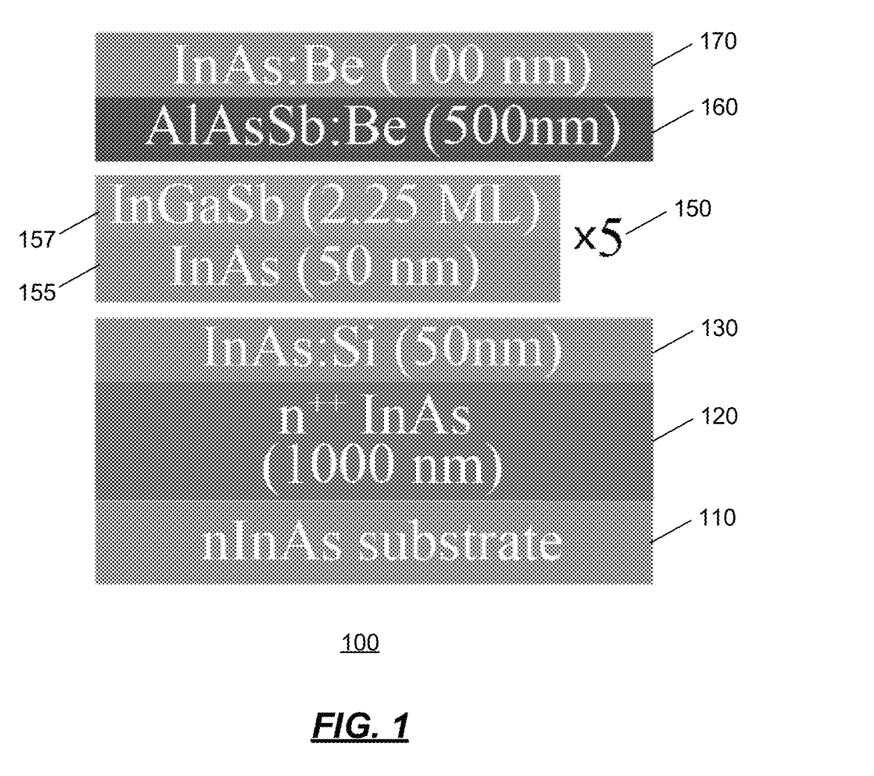
FIG. 1 is a cross-section side view of an example semiconductor structure according to an embodiment.

FIG. 1 is a cross-section side view of an example semiconductor structure 100 according to an embodiment. An n type InAs substrate 110 is provided and a heavily doped n++ InAs layer 120 is grown (or otherwise deposited) thereon. As shown, the layer 120 has a thickness of 1000 nm, though this is not intended to be limiting. The thickness and doping of the layer 120 may change depending on the particular implementation.

A thin layer 130 of InAs:Si (e.g., doped at $10^{18}/cm^3$) is formed above the layer 120. The layer 130 is illustrated as having a thickness of 50 nm, but this is not intended to be limiting. Above the layer 130, five alternating layers 150 of InAs 155 (each 50 nm thick) and InGaSb 157 (each 2.25 ML thick) are grown or otherwise deposited.

Above the layers 150, a layer 160 of AlAsSb:Be (doped at $10^{18}/cm^3$) is grown or deposited (e.g., to a thickness of 500 nm). A layer 170 of InAs:Be (doped at $10^{19}/cm^3$) is then grown or deposited on the layer 160.

In another implementation, instead of a cavity, emission is into surface plasmon polariton modes, which should be very efficient emission into these modes, and then couple out by a grating or pattern on the surface of the emitter.

Figure 2:
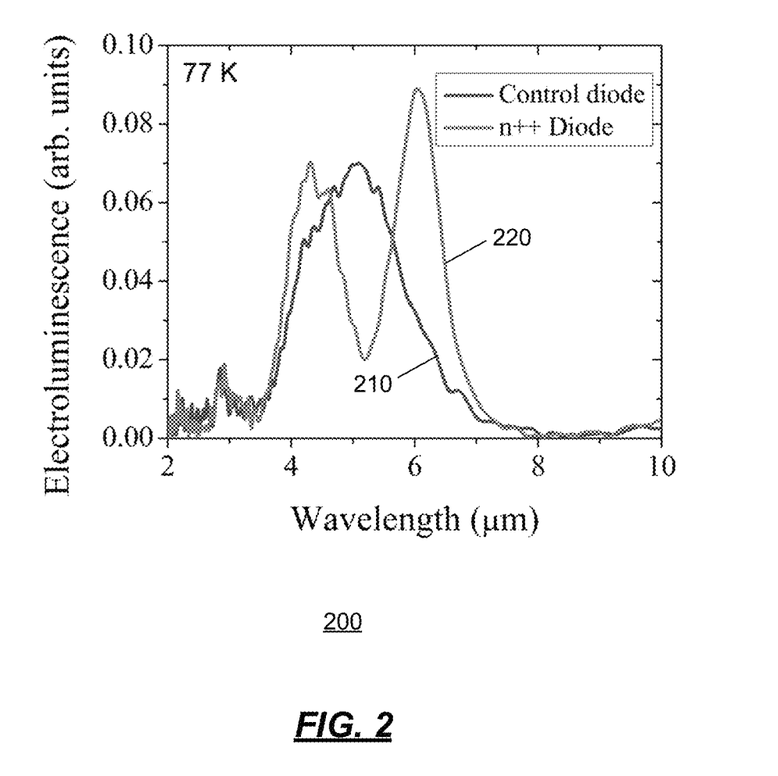
FIG. 2 is a chart of the electroluminescence of the n++ diode of the structure of FIG. 1 and a control diode at 77K.

FIG. 2 is a chart 200 of the electroluminescence of the n+++ diode of the structure 100 of FIG. 1 and a control diode at 77K (the temperature at which the electroluminescence is measured). The electroluminescence curve 210 of an InGaSb control diode is shown, along with the electroluminescence curve 220 of the InGaSb n++ diode of the structure 100.

Figure 3:
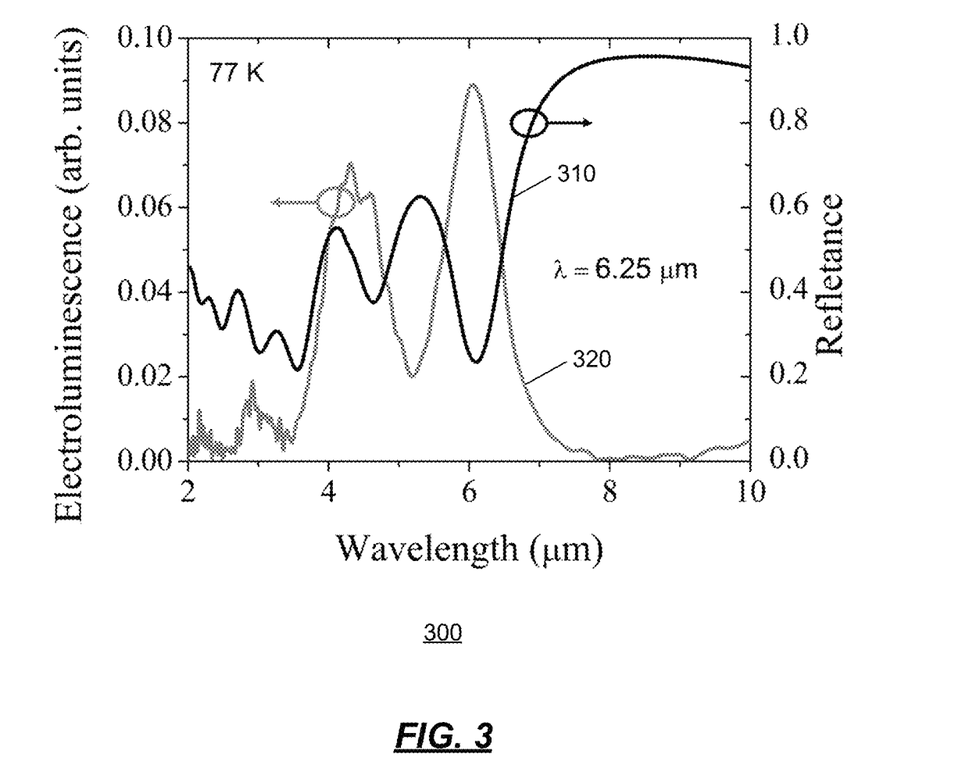
FIG. 3 is a chart of the electroluminescence of the n++ diode of the structure of FIG. 1 with reflectance at 77K.

FIG. 3 is a chart 300 of the electroluminescence of the n++ diode of the structure 100 of FIG. 1 with reflectance at 77K (the temperature at which the electroluminescence is measured). The electroluminescence curve 320 of the InGaSb n++ diode of the structure 100 remains unchanged from curve 220 of FIG. 2. However, the emission is modified by the reflectance of the materials of the structure 100 as shown in the electroluminescence curve 310 (the reflectance spectrum) of the InGaSb n++ diode. The emission is modified by the reflectance of the materials of the structure 100 as shown the measured reflectance curve 310 overlaid with the measured electroluminescence 320.

Figure 4:
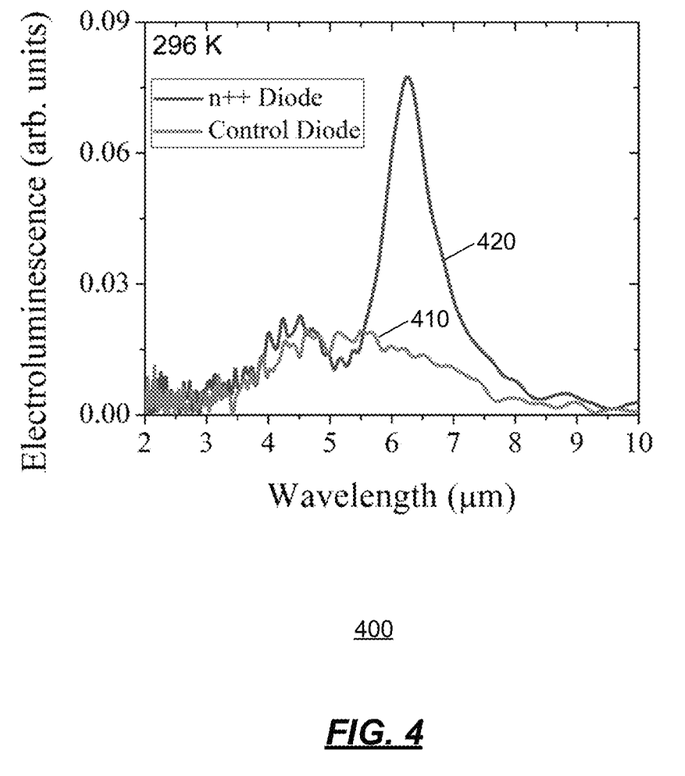
FIG. 4 is a chart of the electroluminescence of the n++ diode of the structure of FIG. 1 and a control diode at 296K.

FIG. 4 is a chart 400 of the electroluminescence of the n++ diode of the structure 100 of FIG. 1 and a control diode at 296K (the temperature at which the electroluminescence is measured). The electroluminescence curve 410 of an InGaSb control diode is shown, along with the electroluminescence curve 420 of the InGaSb n++ diode of the structure 100.

Figure 5:
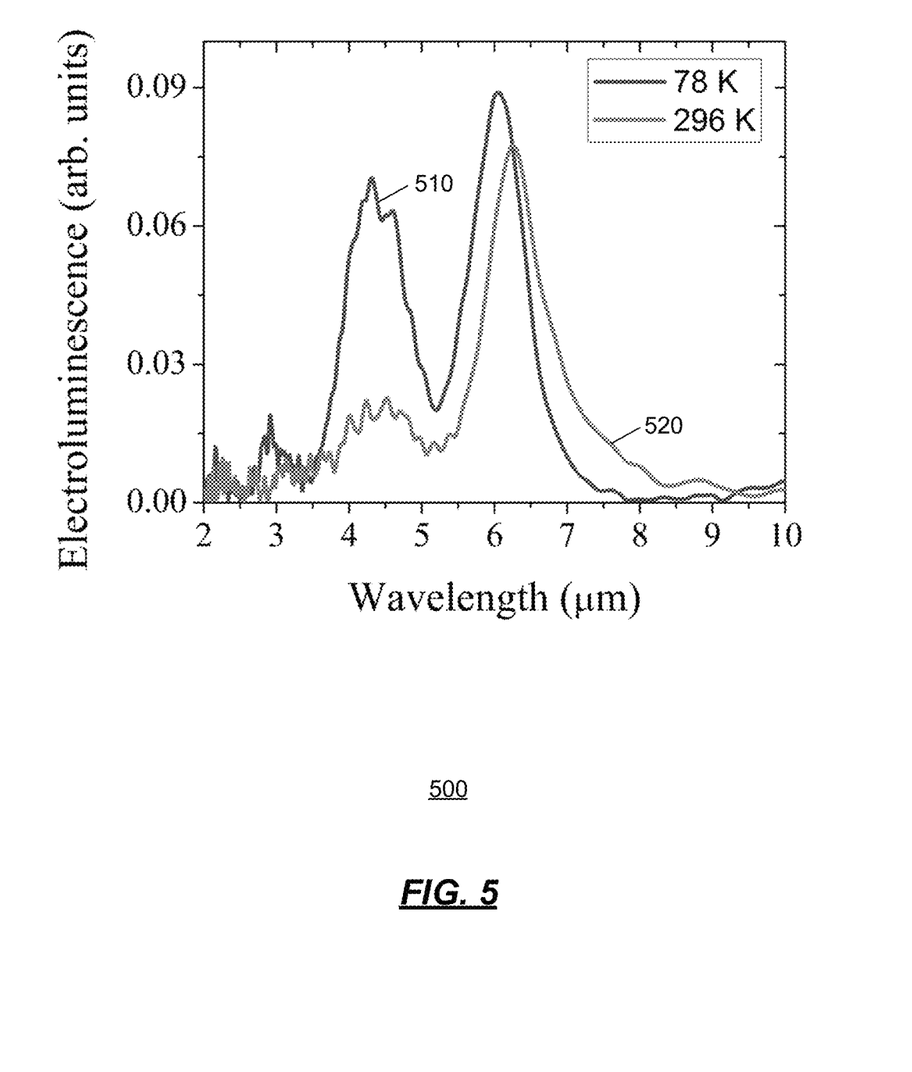
FIG. 5 is a chart comparing emission from the n++ diode of the structure of FIG. 1 at 78K and 296K.

FIG. 5 is a chart comparing emission from the n++ diode of the structure of FIG. 1 at 78K (e.g., low temperature) and 296K (e.g., room temperature), the temperature at which the electroluminescence is measured, as shown in the curves 510, 520, respectively. While the short wavelength feature of the n++ diode (centered around 4.5 µm) decays in intensity as expected, the long wavelength emission peak from the n++ diode shows only a 13% decrease in emission intensity between low temperature and room temperature.

Initial devices grown (i.e., fabricated) show significant improvements in temperature performance and emitted power when compared to commercial devices. Thus, the thin mid-IR LEDS described herein provide improved temperature performance and power efficiency including minimal degradation in emitted power as a temperature is increased from 77K to 300K and higher output power then commercial mid-IR LEDs. For example, the structure may be configured so there is about no temperature degradation of emission from 77K to 300K, as well as output powers of greater than 1.45 µW. There is also a lowered cost of epitaxial growth, and the devices and structures described herein are compatible with LED fabrication processes and have the flexibility to adjust enhancement wavelength by control of an n++ (or other highly doped such as p++ depending on the implementation) layer.

In some implementations, the highly doped (e.g., n++) epitaxial layer is about 500 to 1500 nm thick and is doped to have a plasma wavelength at <7 µm. The highly doped (n++) epitaxial layer may have a plasma wavelength of about 4 to 4.8 µm. The highly doped (n++, for example) epitaxial layer is doped at about $10^{19}/cm^3$, although this is not intended to be limiting as other doping amounts may be used depending on the implementation. Moreover, depending on the implementation, p++ doping may be used instead of n++ doping. Thus, the device structure may be considered agnostic in terms of which emitter architecture to use, as the architecture depends on the implementation. The doping controls a plasma wavelength and the permittivity. Moreover, the doping of the highly doped (n++) epitaxial layer is high enough so that a portion of the structure behaves like an optical metal.

In some implementations, a semiconductor structure comprises an n++ (i.e., highly doped) InAs as a backplane, and a mid-IR light emitting diode (LED) emitter. The doping is not to improve electrical conductor properties, but instead such high doping is performed in order to use its optical properties. The doping is so high (e.g., $10^{19}/cm^3$) that it behaves like an optical metal. Any n-type dopant can be used. It is contemplated that p-type dopants may also be used. In this manner, III-V materials are turned into an optical metal. This allows for reflecting light or forming a cavity, for example.

The mid-IR LED emitter may be based on type-II QD active regions grown with monolithically integrated semiconductor metal layers. More particularly, the mid-IR LED emitter may comprise layers of type-II semiconductor (InGaSb) quantum dots integrated into an InAs pn junction diode grown above the n++ InAs backplane, all in the same epitaxial growth. It is contemplated that other types of mid-IR emitters also work and can be implemented, as long as they are incorporated into the highly doped semiconductor described herein.

The structure is configured to minimize increase radiative recombination rate, which allows for increased efficiency emitters by controlling the emission of the emitting QDs in the near field of an optical metal.

The backplane is a highly doped (n++) epitaxial layer in a range between about 500 to 1500 nm thick and is doped to have a plasma wavelength at less than 7 μm. In some implementations, the backplane has a plasma wavelength of about 4 to 4.8 μm. The backplane is doped at about $10^{19}/cm^3$, although this is not intended to be limiting as other doping amounts may be used depending on the implementation.

Figure 6:
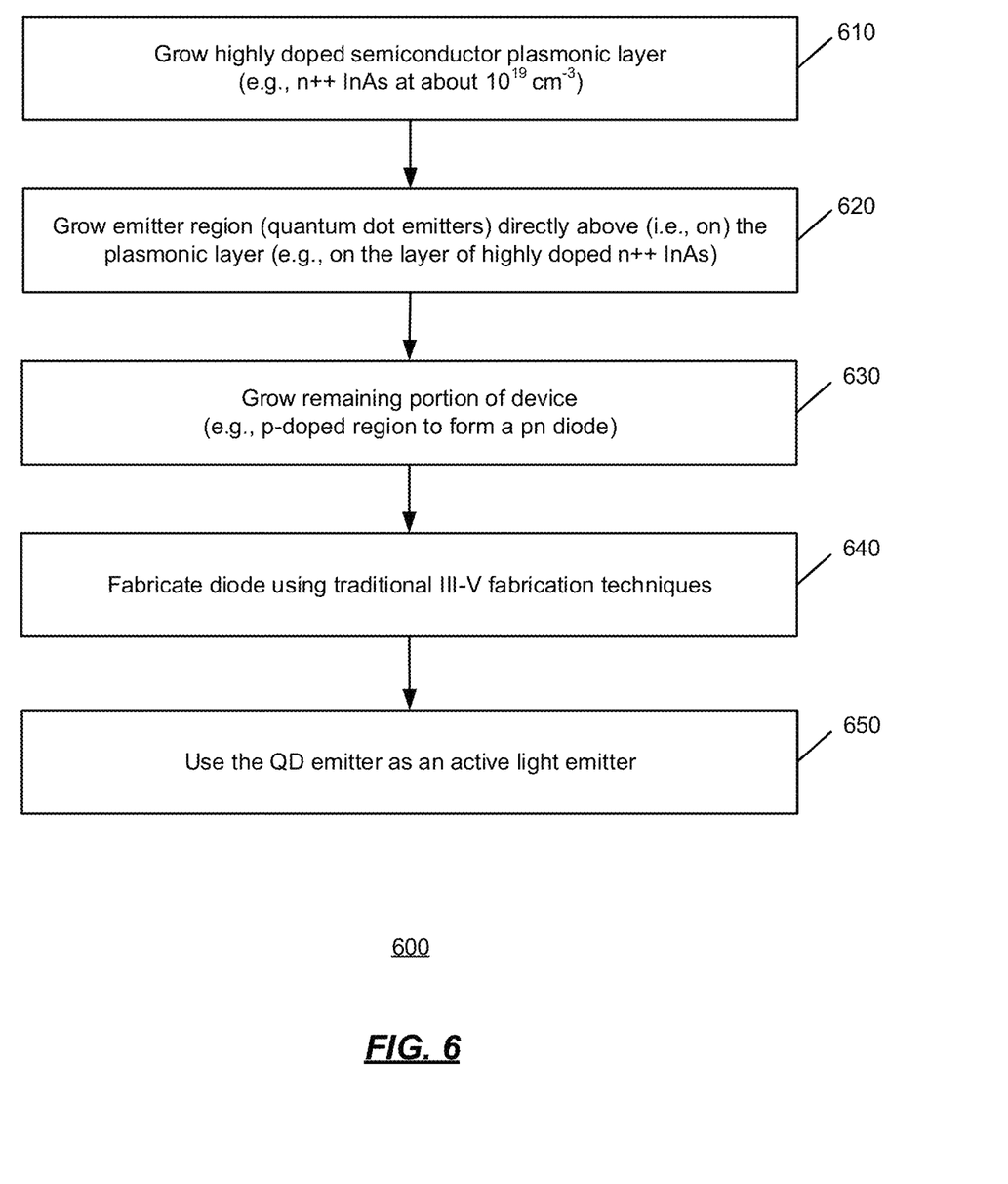
FIG. 6 is an operational flow of an implementation of a method for fabricating a semiconductor structure.

FIG. 6 is an operational flow of an implementation of a method 600 for fabricating a semiconductor structure. In epitaxial growth, the growth of the InAs and the doping occur simultaneously.

At 610, a highly doped semiconductor plasmonic layer (e.g., n++ InAs) is grown (or otherwise deposited) on a substrate to a predetermined thickness (e.g., the InAs is highly doped (e.g., n++ doped at about $10^{19}/cm^3$)). The layer of InAs may be doped high enough so that it becomes optically metallic in the mid-IR range.

At 620, an emitter region structure, such as one or more quantum dot (QD) emitters, is grown directly above (i.e., on) the plasmonic layer (the layer of highly doped (n++) InAs). The QD emitter structure encompasses the entire undoped region between the p and n regions of FIG. 1, for example (e.g., layers 157, 155). In some implementations, the QD emitter is grown directly above (i.e., on) the layer of highly doped (n++) InAs. In this manner, the plasmonic layer (e.g., the n++ InAs) is used as a backplane to an emitter structure.

At 630, the remaining portion of the device is grown (e.g., a p-doped region is grown to form a pn diode). At 640, a diode may be fabricated using traditional (conventional) fabrication techniques (e.g., III-V semiconductor fabrication techniques). At 650, the QD emitter may be used as an active light emitter.

A number of unique effects associated with dipole emitters in the near field of such plasmonic layers (e.g., the n++ InAs material) are leveraged in order to strongly enhance the radiative lifetimes of the QD emitters. The devices are the first examples of quantum engineered emitters integrated monolithically with plasmonic materials (in the same material system, and the same epitaxial growth). Using these techniques, electrically driven plasmonic quantum engineered emitters have been grown and characterized with performance better than commercially available mid-IR LEDs operating at the same wavelength. The results suggest almost no temperature degradation of emission from 77K to 300K, as well as output powers of greater than 1.45 μW, comparable to commercial mid-IR LEDs operating at the same wavelength.

Thus, epitaxial semiconductor metals (highly doped semiconductors) may be integrated with an active region in order to enhance mid-IR emission, thereby improving temperature performance and emitted power. Additionally, a device may be fabricated epitaxially such that an emitter is grown on an n++ backplane. The plasma wavelength is controlled based on the doping. The permittivity is also controlled in this manner. Depending on the implementation, a 4 to 4.8 μm range device may be fabricated in some implementations. Other implementations may extend the range up to 7 μm.

As explained above, existing mid-IR LEDs suffer from poor temperature performance and generally weak emission due to significant non-radiative recombination effects at higher temperatures (room temperature and above). This means that these sources are extremely power inefficient and require significant input power to achieve miniscule optical emission powers. The devices described herein have minimal degradation as a function of increasing temperature and emit more power than existing commercial products. This is a key improvement in performance. In addition, the optical properties of the underlying highly doped semiconductor metal are controlled, which offers the opportunity to control the spectral location of the performance improvement. In addition, the modulation bandwidth of any emitter is tied to the lifetimes of the excited charge carriers in the emitter. The device structure gives significantly faster radiative recombination times, which opens the door to extremely high modulation rates, with potential impact in on-chip optical interconnects and potentially short distance optical communication, for instance in data servers.

Advantages include: lowered cost of epitaxial growth (thinner devices or at least thinner active regions); significant improvement in temperature performance; and significantly higher modulation bandwidth potential, due to increased radiative recombination rate. It is noted that the fabrication method(s) used may be a limiting factor of device performance. More advanced fabrication techniques such as surface texturing, flip chipping, and improving packaging may improve device performance.

Currently, the primary limitations of the devices described and contemplated herein are the limitation of how high the InAs can be doped and how long of a wavelength the QDs can be made to emit. Other mid-IR emitters such as T2SLs may also be used.

It is contemplated that cheap and power efficient mid-IR LEDs are useful for compact sensor systems for gas sensing.

In an implementation, a semiconductor structure comprises: a highly doped (n++) epitaxial layer; and a diode structure disposed above the n++ epitaxial layer.

Implementations may include some or all of the following features. The diode structure comprises an n-doped InAs layer followed by a p-doped InAs layer, with an unintentionally doped layer between the n and p material forming a pn junction which contains a number quantum dot (QD) layers acting as QD emitters. The combination of the n++ and the pn junction creates a cavity, and provides a metallic surface in the near field of the QD emitters which increases radiative recombination rates in the QD layers. The highly doped (n++) epitaxial layer is in the range of about 500 nm to 1500 nm thick, and is doped to have a plasma wavelength of less than 7 μm. The highly doped (n++) epitaxial layer has a plasma wavelength in the range of about 4 μm to 4.8 μm. The doping controls a plasma wavelength and the permittivity. The structure provides improved temperature performance and power efficiency including minimal degradation in emitted power as temperature is increased from 77K to 300K. The highly doped (n++) epitaxial layer is doped at about $10^{19}/cm^3$. The doping of the highly doped (n++) epitaxial layer is high enough so that a portion of the structure behaves like an optical metal. The structure is configured so there is about no temperature degradation of emission from 77K to 300K, and outputs power greater than 1.45 µW.

In an implementation, a semiconductor structure comprises: a plasmonic layer as a backplane; and a mid-IR light emitting diode (LED) emitter.

Implementations may include some or all of the following features. The mid-IR LED emitter is based on type-II quantum dot active regions grown with monolithically integrated semiconductor metal layers. The mid-IR LED emitter comprises layers of type-II semiconductor quantum dots integrated into a pn junction diode grown above the backplane, all in the same epitaxial growth. The plasmonic layer comprises an n++ InAs layer, wherein the type-II semiconductor is InGaSb, and the pn junction diode comprises InAs. The structure is configured to increase radiative recombination rate, which allows for increased efficiency emitters by controlling the emission of the emitting QDs in the near field of an optical metal. The backplane is a highly doped (n++) epitaxial layer in the range of about 500 nm to 1500 nm thick. The backplane is doped at about $10^{19}/cm^3$. The backplane has a plasma wavelength in the range of about 4 µm to 4.8 µm. The backplane is doped to have a plasma wavelength of less than 7 µm.

In an implementation, a method of fabricating a semiconductor structure comprises: depositing a plasmonic layer on a substrate; and growing a quantum dot (QD) emitter above the plasmonic layer.

Implementations may include some or all of the following features. The method further comprises doping the plasmonic layer so that it becomes optically metallic in the mid-IR range. The plasmonic layer is a layer of highly doped (n++) InAs. The InAs layer is doped at about $10^{19}/cm^3$. The method further comprises using the QD emitter as an active light emitter.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A semiconductor structure comprising:
   a highly doped (n++) plasmonic epitaxial layer; and
   a diode structure disposed above the n++ epitaxial layer,
   wherein the diode structure is monolithically integrated with the highly doped (n++) plasmonic epitaxial layer in an all-epitaxial growth, and
   wherein the highly doped (n++) plasmonic epitaxial layer is doped such that is optically metallic in a mid-IR range.

2. The semiconductor structure of claim 1, wherein the diode structure comprises an n-doped InAs layer followed by a p-doped InAs layer, with an unintentionally doped layer between the n and p material forming a pn junction which contains a number quantum dot (QD) layers acting as QD emitters.

3. The semiconductor structure of claim 2, wherein the combination of the n++ and the pn junction creates a cavity.

4. The semiconductor structure of claim 1, wherein the highly doped (n++) epitaxial layer is in the range of about 500 nm to 1500 nm thick, and is doped to have a plasma wavelength of less than 7 µm.

5. The semiconductor structure of claim 1, wherein the highly doped (n++) epitaxial layer has a plasma wavelength in the range of about 4 µm to 4.8 µm.

6. The semiconductor structure of claim 1, wherein the highly doped (n++) epitaxial layer is doped at about $10^{19}/cm^3$.

7. The semiconductor structure of claim 1, wherein the doping of the highly doped (n++) epitaxial layer is high enough so that a portion of the structure behaves like an optical metal.

8. The semiconductor structure of claim 1, wherein the structure is configured, such that when a drive current is applied to the structure, there is about no temperature degradation of emission from 77K to 300K, and outputs power greater than 1.45µ W.

9. A semiconductor structure comprising:
   a plasmonic layer as a backplane; and
   a mid-IR light emitting diode (LED) emitter,
   wherein the mid-IR LED emitter comprises layers of type-II semiconductor quantum dots integrated into a pn junction diode grown above the backplane, all in the same epitaxial growth, and
   wherein the plasmonic layer is optically metallic in the mid-IR range.

10. The semiconductor structure of claim 9, wherein the mid-IR LED emitter is based on type-II quantum dot active regions grown with monolithically integrated semiconductor metal layers.

11. The semiconductor structure of claim 9, wherein the plasmonic layer comprises an n++ InAs layer, wherein the type-II semiconductor is InGaSb, and the pn junction diode comprises InAs.

12. The semiconductor structure of claim 9, wherein the backplane is a highly doped (n++) epitaxial layer in the range of about 500 nm to 1500 nm thick.

13. The semiconductor structure of claim 9, wherein the backplane is doped at about $10^{19}/cm^3$.

14. The semiconductor structure of claim 9, where the backplane has a plasma wavelength in the range of about 4 µm to 4.8 µm.

15. The semiconductor structure of claim 9, where the backplane is doped to have a plasma wavelength of less than 7 µm.

* * * * *